(12) United States Patent
Kawanami et al.

(10) Patent No.: US 8,778,469 B2
(45) Date of Patent: Jul. 15, 2014

(54) ELECTRONIC DEVICE AND METHOD FOR MANUFACTURING SAME

(75) Inventors: Sohei Kawanami, Tokyo (JP);
Yoshinori Ami, Koriyama (JP); Yoko Mitsui, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 13/614,475

(22) Filed: Sep. 13, 2012

(65) Prior Publication Data

US 2013/0011598 A1  Jan. 10, 2013

Related U.S. Application Data

(63) Continuation of application No. PCT/JP2011/056627, filed on Mar. 18, 2011.

(30) Foreign Application Priority Data

Mar. 19, 2010 (JP) .................. 2010-063839

(51) Int. Cl.
| | |
|---|---|
| *B32B 7/04* | (2006.01) |
| *B32B 17/00* | (2006.01) |
| *C03B 23/20* | (2006.01) |
| *C03B 23/203* | (2006.01) |
| *H05B 33/04* | (2006.01) |
| *H05B 33/10* | (2006.01) |
| *G02F 1/13* | (2006.01) |

(52) U.S. Cl.
USPC .............. 428/34; 428/76; 428/426; 428/432; 313/495; 313/506; 313/512; 313/587; 349/153; 445/24; 445/25; 501/15; 501/16; 501/19; 501/21; 501/26; 65/36; 65/43; 65/58

(58) Field of Classification Search
USPC .............. 428/34, 76, 426, 432, 433; 313/495, 313/496, 497, 500, 501, 502, 503, 504, 505, 313/506, 507, 508, 509, 510, 511, 512, 582, 313/583, 584, 585, 586, 587; 349/153, 154; 445/24, 25; 501/15, 16, 19, 21, 26
See application file for complete search history.

(56) References Cited

U.S. PATENT DOCUMENTS 6,998,776 B2     2/2006 Aitken et al.
(Continued)

FOREIGN PATENT DOCUMENTS

| JP | 2000-169168 | 6/2000 |
|---|---|---|
| JP | 2006-524419 | 10/2006 |
| JP | 2007-8808 | 1/2007 |
| JP | 2008-59802 | 3/2008 |

(Continued)

*Primary Examiner* — Maria Veronica Ewald
*Assistant Examiner* — Joanna Pleszczynska
(74) *Attorney, Agent, or Firm* — Oblon, Spivak, McClelland, Maier & Neustadt, L.L.P.

(57) ABSTRACT

When local heating by use of laser sealing or the like is applied, the bonding strength between glass substrates and a sealing layer is improved to provide an electronic device having increased reliability. An electronic device includes a first glass substrate, a second glass substrate, and a sealing layer to seal an electronic element portion disposed between these glass substrates. The sealing layer is a layer obtained by locally heating a sealing material by an electromagnetic wave, such as laser light or infrared light, to melt-bond the sealing material, the sealing material containing sealing glass, a low-expansion filler and an electromagnetic wave absorber. In the first and second glass substrates, each reacted layer is produced to have a maximum depth of at least 30 nm from an interface with the sealing layer.

21 Claims, 5 Drawing Sheets

(56) References Cited

U.S. PATENT DOCUMENTS

2004/0207314 A1 10/2004 Aitken et al.
2006/0105898 A1* 5/2006 Ide ................................ 501/50
2007/0001579 A1 1/2007 Jeon et al.
2007/0197120 A1* 8/2007 Lee ................................ 445/25
2011/0223371 A1 9/2011 Kawanami

FOREIGN PATENT DOCUMENTS

| | | |
|---|---|---|
| JP | 2008-115057 | 5/2008 |
| JP | 2009-227566 | 10/2009 |
| JP | 4540669 | 7/2010 |
| WO | 2009/107428 | 9/2009 |
| WO | 2010/067848 | 6/2010 |

* cited by examiner

ELECTRONIC DEVICE AND METHOD FOR MANUFACTURING SAME

TECHNICAL FIELD

The present invention relates to an electronic device and a process for producing the same.

BACKGROUND ART

A flat panel display device (FPD), such as an organic EL (electroluminescence) display (OELD), a plasma display panel (PDP) or a liquid crystal display device (LCD), has such a structure that a glass substrate for an element having a light-emitting element formed and a glass substrate for sealing are disposed to face each other and the light-emitting element or the like is sealed in a glass package comprising two such glass substrates bonded. Further, for a solar cell, such as a dye-sensitized solar cell, application of a glass package having a solar cell element (dye-sensitized photoelectric conversion element) sealed with two glass substrates has been studied.

As a sealing material to seal a space between two glass substrates, a sealing resin or sealing glass has been used. Since an organic EL (OEL) element or the like is likely to undergo deterioration by water, the application of sealing glass excellent in moisture resistance, etc. is in progress. Since the sealing temperature of the sealing glass is at a level of 400 to 600° C., properties of the electronic element portion of the OEL element or the like will be deteriorated when firing is conducted by using a heating furnace. Accordingly, it has been attempted that a layer of a glass material for sealing containing a laser absorbent (sealing material layer) is disposed between sealing regions provided on the peripheral portions of two glass substrates, and the layer of the glass material for sealing is locally heated and melt to perform sealing by being irradiated with laser light (Patent Documents 1 to 3).

In order to carry out sealing by locally heating by use of laser light (laser sealing), vanadium glass (see Patent Document 1), bismuth glass or phosphate glass (see Patent Documents 2 and 3) or the like have been employed as the sealing glass (glass frit). While the laser sealing can suppress thermal influences on the electronic element portion, it is likely that residual stress is generated at the bonding interfaces between the glass substrates and a sealing layer formed by a melt-bonded layer of a sealing material layer since the laser sealing is a process for locally and quickly heating and cooling the sealing material layer. The generation of residue stress at the bonding interfaces causes cracks or fractures in the boding portion or the glass substrates, or a decrease in the bonding strength between the glass substrates and the bonding layer.

When the local heating and sealing operation, such as laser sealing, is applied to seal the space between the two glass substrates, it is likely that the local heating and sealing process generates residual stress at the bonding interfaces between the glass substrates and the sealing layer, which causes a problem in that it is impossible to sufficiently increase the bonding strength between the glass substrates and the sealing layer. This problem becomes a factor for reducing the reliability of FPDs, such as OELDs, PDPs and LCDs, or solar cells. The decrease in the bonding strength caused by the local heating and sealing process occurs not only in laser sealing but also in e.g. local heating by use of infrared light.

PRIOR ART DOCUMENTS

Patent Documents

Patent Document 1: JP-A-2006-524419
Patent Document 2: JP-A-2008-059802
Patent Document 3: JP-A-2008-115057

DISCLOSURE OF INVENTION

Technical Problem

It is an object of the present invention to provide an electronic device and a process for producing the same, which are capable of having increased airtightness and reliability with high reproducibility by improving the bonding strength between glass substrates and a sealing layer when applying local heating to sealing between the two glass substrates.

Solution to Problem

The electronic device according to a mode of the present invention is characterized to comprise a first glass substrate having a surface including a first sealing region; a second glass substrate having a surface, the surface including a second sealing region corresponding to the first sealing region and disposed so as to face the surface of the first glass substrate; an electronic element portion disposed between the first glass substrate and the second glass substrate; and a sealing layer formed between the first sealing region of the first glass substrate and the second sealing region of the second glass substrate so as to seal the electronic element portion; wherein the sealing layer comprises a melt-bonded layer which is obtained by locally heating a sealing material, the sealing material containing sealing glass, a low-expansion filler and an electromagnetic wave absorbent, and wherein reacted layers are produced in the first and second glass substrates by reaction with the sealing layer, each of the reacted layers having a maximum depth of at least 30 nm from an interface with the sealing layer.

The process for producing an electronic device according to a mode of the present invention is characterized to comprise preparing a first glass substrate having a surface including a first sealing region; preparing a second glass substrate having a surface including a second sealing region corresponding to the first sealing region, and a sealing material layer formed in the second sealing region, the sealing material layer comprising a fired layer of a sealing material containing sealing glass, a low-expansion filler and an electromagnetic wave absorbent, the sealing glass comprising bismuth glass containing 70 to 90% of $Bi_2O_3$, 1 to 20% of ZnO, 2 to 12% of $B_2O_3$, and 10 to 380 ppm of an alkaline metal oxide by mass proportion; laminating the first glass substrate and the second glass substrate through the sealing material layer with the surface of the first glass substrate and the surface of the second glass substrate facing each other; and irradiating the sealing material layer with an electromagnetic wave through the first glass substrate and/or the second glass substrate to locally heat the sealing material layer such that when the sealing glass has a softening point temperature of T(° C.), the sealing material layer is heated at a temperature in a range of at least (T+200° C.) to at most (T+800° C.), whereby the sealing material layer is melted to form a sealing layer to seal an electronic element portion disposed between the first glass substrate and the second glass substrate.

The process for producing an electronic device according to another mode of the present invention is characterized to comprise preparing a first glass substrate having a surface including a first sealing region; preparing a second glass substrate having a surface including a second sealing region corresponding to the first sealing region, and a sealing material layer formed in the second sealing region, the sealing material layer comprising a fired layer of a sealing material containing sealing glass, a low-expansion filler and an electromagnetic wave absorbent, the sealing glass comprising bismuth glass containing 70 to 90% of $Bi_2O_3$, 1 to 20% of ZnO, 2 to 12% of $B_2O_3$ and 10 to 380 ppm of $Na_2O$ by mass proportion; laminating the first glass substrate and the second glass substrate through the sealing material layer with the surface of the first glass substrate and the surface of the second glass substrate facing each other; and irradiating the sealing material layer with an electromagnetic wave through the first glass substrate and/or the second glass substrate to locally heat the sealing material layer such that when the sealing glass has a softening point temperature of T(° C.), the sealing material layer is heated at a temperature in a range of at least (T+200° C.) to at most (T+800° C.), whereby the sealing material layer is melted to form a sealing layer to seal an electronic element portion disposed between the first glass substrate and the second glass substrate.

In the above-mentioned processes for producing an electronic device, either one of the step for preparing the first glass substrate and the step for preparing the second glass substrate may be first carried out, or both of them may be simultaneously carried out. After the step for preparing the first glass substrate and the step for preparing the second glass are both completed, the step for laminating the first glass substrate and the second glass substrate and the step for forming the sealing layer are sequentially carried out.

The word "to" in each of the above-mentioned numerical ranges means to include the values before and after the word as the lower limit and the upper limit, respectively. This is also applicable to the word "to" in Description.

Advantageous Effects of Invention

In accordance with the electronic device and the processes for producing the same of the present invention, it is possible to improve the bonding strength between glass substrates and a sealing layer by applying local heating to seal the glass substrates as described above. Accordingly, the electronic device is provided, with high reproducibility, so as to have increased airtightness and reliability.

DESCRIPTION OF EMBODIMENTS

Figure 1:
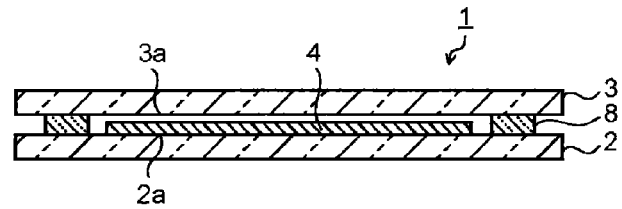
FIG. 1 is a cross-sectional view illustrating the constitution of an electronic device according to an embodiment of the present invention.
Figure 2:
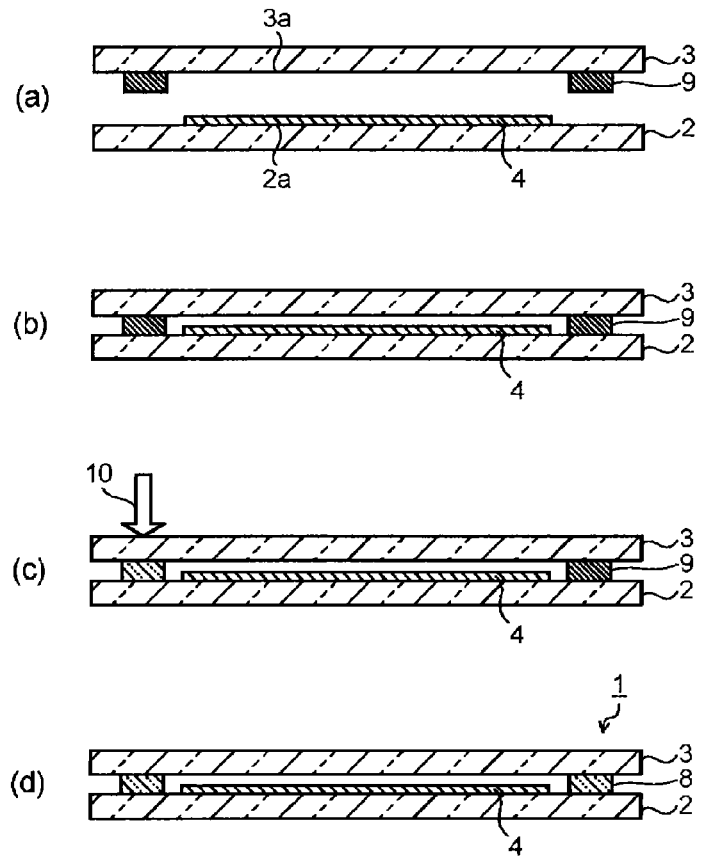
FIG. 2 is cross-sectional views illustrating a procedure for production of the electronic device according to the embodiment of the present invention.
Figure 3:
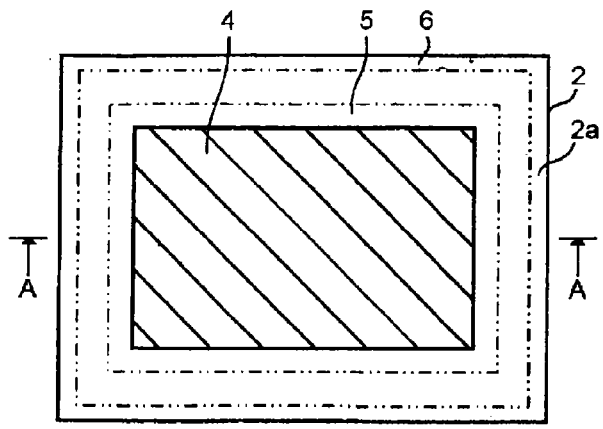
FIG. 3 is a plan view illustrating a first glass substrate used in the procedure for production of the electronic device shown in FIG. 2.
Figure 4:
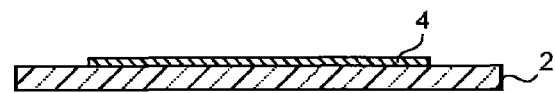
FIG. 4 is a cross-sectional view along line A-A in FIG. 3.
Figure 5:
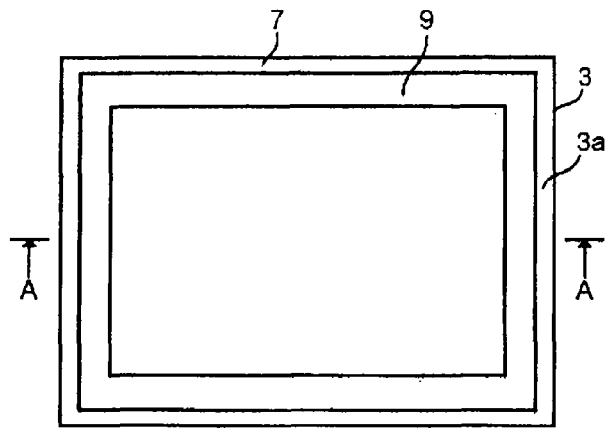
FIG. 5 is a plan view illustrating a second glass substrate used in the procedure for production of the electronic device shown in FIG. 2.
Figure 6:
FIG. 6 is a cross-sectional view along line A-A in FIG. 5.

Now, embodiments of the present invention will be described with reference to drawings. FIG. 1 is a view illustrating the constitution of the electronic device according to an embodiment of the present invention, FIG. 2 is views illustrating a procedure for production of such an electronic device, and FIGS. 3 and 4 are views illustrating the structure of a first glass substrate used therefor. FIGS. 5 and 6 are views illustrating the structure of a second glass substrate used therefor.

The electronic device 1 shown in FIG. 1 constitutes an FPD, such as an OELD, a PDP or an LCD, an illumination apparatus employing a light-emitting element, such as an OEL element (OEL illumination), or a solar cell or the like, such as a dye-sensitized solar cell. The electronic device 1 includes the first glass substrate 2 and the second glass substrate 3. Each of the first and second glass substrates 2 and 3 may be made of alkali-free glass, soda lime glass or the like, each of which may contain any kind of known composition. Alkali-free glass has a thermal expansion coefficient at a level of 35 to 40×10$^{-7}$/° C. Soda lime glass has a thermal expansion coefficient at a level of 80 to 90×10$^{-7}$/° C. Such alkali-free glass may be typically constituted by 50 to 70% of $SiO_2$, 1 to 20% of $Al_2O_3$, 0 to 15% of $B_2O_3$, 0 to 30% of MgO, 0 to 30% of CaO, 0 to 30% of SrO and 0 to 30% of BaO by mass percentage. Such soda lime glass may be typically constituted by 55 to 75% of $SiO_2$, 0.5 to 10% of $Al_2O_3$, 2 to 10% of CaO, 0 to 10% of SrO, 1 to 10% of $Na_2O$ and 0 to 10% of $K_2O$ by mass percentage. The respective compositions are not limited to the above-mentioned ones.

Between a surface 2a of the first glass substrate 2 and a surface 3a of the second glass substrate 3 facing thereto, is disposed an electronic element portion 4 having a desired function of the electronic device 1. The electronic element portion 4 includes e.g. an OEL element for OELDs or OEL illumination, a plasma light-emitting element for PDPs, a liquid crystal display element for LCDs, and a dye-sensitized solar cell element (dye-sensitized photoelectric conversion element) for solar cells. The electronic element portion 4, which includes a light-emitting element like an OEL element, a dye-sensitized solar cell element or the like, may have any kind of known structure. The electronic device 1 according to this embodiment may have any kind of element structure in the electronic element portion 4.

In the electronic device 1 shown in FIG. 1, the first glass substrate 2 constitutes a glass substrate for an element and has an element structure, such as an OEL element or a PDP element, formed as the electronic element portion 4 thereon. The second glass substrate 3 constitutes a glass substrate, which serves the function of sealing the electronic element portion 4 formed on the first glass substrate 2. It should be noted that the structure of the electronic device 1 is not limited to the above-mentioned one. For example, when the electronic element portion 4 is a dye-sensitized solar cell or the like, each of the surfaces 2a and 3a of the first and second glass substrates 2 and 3 has an element film, such as a wiring film or an electrode film, formed thereon so as to form an element structure. The element film constituting the electronic element portion 4 and an element structure constituted thereby may be formed at least one of the surfaces 2a and 3a of the first and second glass substrates 2 and 3.

On the surface 2a of the first glass substrate 2 used to fabricate the electronic device 1, a first sealing region 6 is disposed along the outer periphery of an element-formed region 5 as shown in FIGS. 3 and 4, where the electronic element portion 4 is disposed. The first sealing region 6 is formed so as to surround the element-formed region 5. The surface 3a of the second glass substrate 3 has a second sealing region 7 disposed thereon so as to correspond to the first sealing region 6 as shown in FIGS. 5 and 6. Each of the first and second sealing regions 6 and 7 serves as a sealing layer-formed region (a sealing material layer-formed region in the case of the second sealing region 7). The surface 3a of the second glass substrate may have an element region disposed thereon as required.

The first glass substrate 2 and the second glass substrate 3 are disposed to have a desired space therebetween such that the surface 2a with the element-formed region 5 and the first sealing region 6 faces the surface 3a with the second sealing region 7. The space between the first glass substrate 2 and the second glass substrate 3 is sealed by a sealing layer 8. In other words, the sealing layer 8 is disposed between the sealing region 6 of the first glass substrate 2 and the sealing region 7 of the second glass substrate 3 so as to seal the electronic element portion 4. The electronic element portion 4 is hermetically sealed by a glass panel constituted by the first glass substrate 2, the second glass substrate 3 and the sealing layer 8. Preferably, the sealing layer 8 has a thickness of 2 to 15 μm and a width of 0.2 to 1.5 mm (hereinbelow, also referred to as line width) for example. The sealing layer 8 is normally formed in a frame shape along the entire periphery of each of the first and second glass substrates on the first sealing region 6 and the second sealing region 7.

When an OEL element or the like is applied to the electronic element portion 4, the space between the first glass substrate 2 and the second glass substrate 3 is partly unfilled or unoccupied. Such a partially unoccupied space may be left as it is or filled with a transparent resin or the like. The transparent resin may be bonded to the glass substrates 2 and 3 or be in mere contact with the glass substrates 2 and 3. When a dye-sensitized solar cell element or the like is applied to the electronic element portion 4, the electronic element portion 4 is disposed in the entire space between the first glass substrate 2 and the second glass substrate 3.

The sealing layer 8 is constituted by a melt-bonded layer, which is formed by melting a sealing material layer 9 formed in the sealing region 7 of the second glass substrate 3 and bonding the melted sealing material layer to the sealing region 6 of the first glass substrate 2. The sealing material layer 9 is melted by local heating by use of an electromagnetic wave 10, such as laser light or infrared light. Specifically, the sealing material layer 9 is disposed in a frame shape as shown in FIGS. 5 and 6 in the sealing region 7 of the second glass substrate 3 used for fabricating the electronic device 1. The sealing material layer 9 disposed in the sealing region 7 of the second glass substrate 3 is melted and bonded to the sealing region 5 of the first glass substrate 2 by use of heat of the electromagnetic wave 10, such as laser light or infrared light, such that the sealing layer 8 is disposed so as to hermetically seal the space between the first glass substrate 2 and the second glass substrate 3 (element-formed space).

The sealing material layer 9 is a fired layer, which is made of a sealing material (glass material for sealing) containing sealing glass (glass frit) of low temperature melting glass, an electromagnetic wave absorbent (material to absorb an electromagnetic wave, such as laser light or infrared light, to generate heat) and a low-expansion filler. The sealing material contains such a low-expansion filler in order to match the thermal expansion coefficient of the sealing material with the thermal expansion coefficient of each of the glass substrates 2 and 3. The sealing material is made of such sealing glass as the main component, and such an electromagnetic wave absorbent and such a low-expansion filler incorporated. The sealing material may contain additives in addition to these components as the case requires.

The sealing glass may be low temperature melting glass, such as bismuth glass, tin-phosphate glass, vanadium glass, borosilicate-alkali glass or lead glass. Among them, bismuth glass is particularly preferred. The content of the sealing glass is preferably in a range of 49.9 to 97.9 vol % to the sealing material. When the content of the sealing glass is less than 49.9 vol %, the fluidity of the sealing material at the time of melting may be deteriorated to decrease adhesion. When the content of the sealing glass exceeds 97.9 vol %, fractures may be caused by distortion since the difference in thermal expansion between the sealing material layer and the glass substrates is too large. The content of the sealing glass is preferably in a range of 60 to 85 vol %.

As the electromagnetic wave absorbent, at least one metal (containing alloy) selected from a group consisting of Fe, Cr, Mn, Co, Ni and Cu, or a compound, such as an oxide containing at least one of the above metal, may be used. The content of the laser absorbent is preferably in a range of 0.1 to 40 vol % to the sealing material. When the content of the electromagnetic wave absorbent is less than 0.1 vol %, the sealing material layer 9 will not sufficiently be melted when being irradiated with laser light or infrared light. When the content of the electromagnetic wave absorbent exceeds 40 vol %, a portion of the sealing material layer in the vicinity of the interface with the second glass substrate 3 may locally generate heat at the time of being irradiated with laser light or infrared light, such that fractures may occur in the second glass substrate 3, or the fluidity of the sealing material at the time of melting may be deteriorated, whereby the adhesion to the first glass substrate 2 may be decreased. In particular, when the sealing material layer 9 has a thickness of at least 7 μm, the content of the electromagnetic wave absorbent is preferably in a range of 0.1 to 10 vol %, more preferably in a range of 1 to 9 vol %. When the sealing material layer 9 has a thickness set at less than 7 μm, the content of the electromagnetic wave absorbent is preferably in a range of 2 to 40 vol %, more preferably in a range of 3 to 25 vol %.

The low-expansion filler may be at least one member selected from a group consisting of silica, alumina, zirconia, zirconium silicate, aluminum titanate, mullite, cordierite, eucryptite, spodumene, a zirconium phosphate compound, a tin oxide compound and a silica solid solution. Examples of such a zirconium phosphate compound include $(ZrO)_2P_2O_7$, $NaZr_2(PO_4)_3$, $KZr_2(PO_4)_3$, $Ca_{0.5}Zr_2(PO_4)_3$, $Na_{0.5}Nb_{0.5}Zr_{1.5}(PO_4)_3$, $K_{0.5}Nb_{0.5}Zr_{1.5}(PO_4)_3$, $Ca_{0.25}Nb_{0.5}Zr_{1.5}(PO_4)_3$, $NbZr(PO_4)_3$, $Zr_2(WO_3)(PO_4)_2$, and a composite compound thereof. The low-expansion filler is one having a lower thermal expansion coefficient than the sealing glass as the main component of the sealing material.

The content of the low-expansion filler is properly determined so that the thermal expansion coefficient of the sealing glass is close to the thermal expansion coefficients of the glass substrates 1 and 2. The low-expansion filler is contained preferably in an amount of 1 to 50 vol % to the glass material for sealing, although it depends on the thermal expansion coefficients of the sealing glass and the glass substrates 2 and 3. When the content of the low-expansion filler is less than 1 vol %, it is unlikely to sufficiently have an advantage of controlling the thermal expansion coefficient of the sealing glass. On the other hand, when the content of the low-expansion filler exceeds 50 vol %, it is likely that the fluidity of the sealing material deteriorates to reduce the bonding strength. In particular, when the sealing material has a thickness of at least 7 μm, the content of the low-expansion filler is preferably 10 to 50 vol %, more preferably 15 to 40 vol %. On the other hand, when the sealing material has a thickness of less than 7 μm, the content of the low-expansion filler is preferably 1 to 40 vol %, more preferably 2 to 30 vol %.

Figure 7:
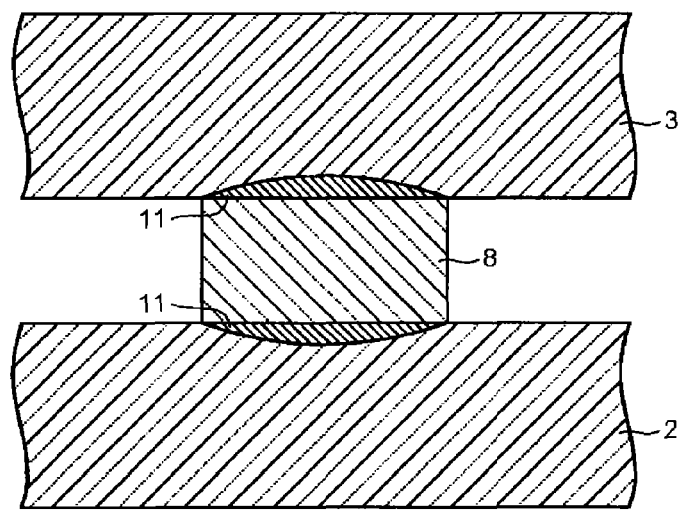
FIG. 7 is a cross-sectional view illustrating the electronic device shown in FIG. 1 with some parts thereof being enlarged.

Incidentally, when the local heating by use of the electromagnetic wave 10, such as laser light or infrared light, is applied to heat and melt the sealing material layer 9, it is likely that the quick heating and cooling process causes residual stress to be generated at the bonding interfaces between the glass substrates 2 and 3, and the sealing layer 8 as described above. The residual stress generated at the bonding interfaces becomes a factor for reducing the bonding strength between the glass substrates 2 and 3, and the sealing layer 8. In order to cope with this problem, in the electronic device 1 according to this embodiment, each of the first and second glass substrates 2 and 3 has a reacted layer 11 (i.e. reacted layer between each of the glass substrates 2 and 3 and the sealing layer 8) generated therein so as to have a maximum depth of at least 30 nm from the interface with the sealing layer 8 as shown in FIG. 7 as an enlarged view.

Each reacted layer 11 is a mixed layer containing a plurality of elements which are of the same kinds as the constituent elements of the glass substrates 2 and 3 and as the constituent elements of the sealing layer 8. By generating the reacted layers 11 in the glass substrates 2 and 3 and setting the maximum depth at least 30 nm, it is possible to obtain a firm bonding state between the glass substrates 2 and 3 and the sealing layer 8. The above-mentioned generation of the reacted layers 11 in the glass substrates 2 and 3 means that the reacted layers are generated inwardly from the faces of the forming regions of the sealing layer 8 on the glass substrates. Accordingly, even in a case where such a local and quick heating and cooling process causes residual stress to be generated at the bonding interfaces between the glass substrates 2 and 3 and the sealing layer 8, it is possible to enhance the bonding strength between the glass substrates 2 and 3 and the sealing layer 8. When each reacted layer has a maximum depth of less than 30 nm, it is impossible to sufficiently obtain an advantage of enhancing the bonding strength. Each reacted layer has a maximum depth of preferably at least 50 nm, more preferably at least 150 nm.

Each reacted layer 11 is preferably configured such that a central portion thereof and a portion thereof close to the central portion project inwardly in the first and second glass substrates 2 or 3 in comparison with an end portion thereof. In other words, each reacted layer 11 is preferably configured to have a larger inward depth in a central portion thereof and a portion thereof close to the central portion than the inward depth in an end portion thereof. Examples of the configuration include an arch shape or a shape similar to the bottom of a pan. The provision of the reacted layers 11 allows the bonding strength between the glass substrates 2 and 3 and the sealing layer 8 to be further enhanced since the stress generated at the interface between each of the glass substrates 2 and 3 and each of the reacted layers 11 can be dispersed throughout the reacted layers 11. When each reacted layer has a uniform depth, it is likely that residual stress converges to a side face or a bottom face etc. of each reacted layer. The configuration of the reacted layers 11 is not limited to the shape shown in FIG. 7 and may be a shape having a plurality of projections.

Figure 8:
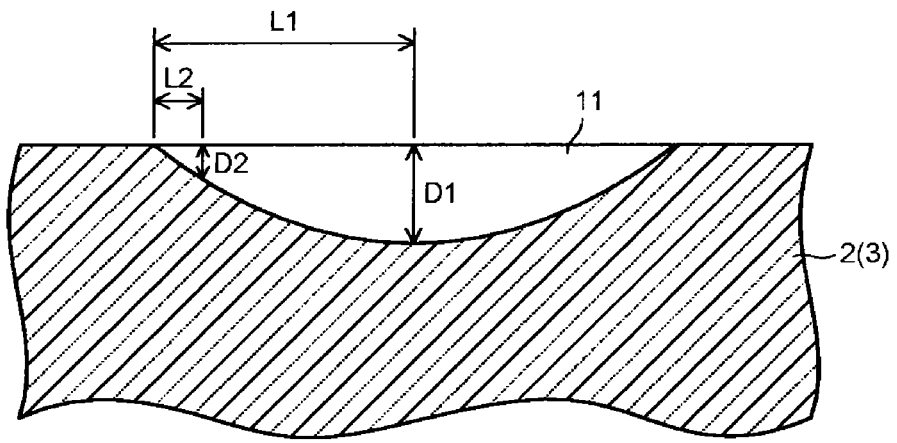
FIG. 8 is a schematic view illustrating a reacted layer portion produced in a glass substrate of the electronic device shown in FIG. 7.

As a specific configuration of the above-mentioned reacted layers 11, it is preferred that the reacted layers 11 be formed in a projected shape so as to have a maximum depth D1 of at least 1.1 times the depth D2 in the vicinity of an end portion of the sealing layer 8 (D1/D2≥1.1) as shown in FIG. 8 (in other words, the reacted layers project toward the glass substrates so as to have a downwardly projected shape in FIG. 8). When the length from an end portion of each reacted layer 11 to a position having the maximum depth D1 is L1, the depth D2 of each reacted layer 11 in the vicinity of the end portion thereof is determined to be a depth at a position having a distance L2 (L2=(1/10)×L1). When the reacted layers have a plurality of projected portions (e.g. two projected portions), D1/D2 is determined to be found based on the maximum depth D1 and the depth D2 at a position having a distance L2 that is 1/10 of a distance L1 from a closest end portion of each of the reacted layers to a position having the maximum depth D1.

When the reacted layers 11 are formed such that the ratio of the maximum depth D1 to the depth D2 in the vicinity of an end portion thereof (D1/D2) is at least 1.1, it is possible not only to further enhance the bonding strength between the glass substrates 2 and 3 and the sealing layer 8 but also to obtain, with high reproducibility, the dispersing effect for stress generation at the interface between each of the glass substrates 2 and 3 and each of the reacted layers 11. In other words, it is possible not only to increase the formation amount of the reacted layers 11 but also to form the reacted layers 11 in such a shape to further project into the glass substrates 2 and 3 by setting the ratio of D1/D2 to at least 1.1. Accordingly, it is possible not only to further improve the bonding strength between the glass substrates 2 and 3 and the sealing layer 8 but also to further improve the dispersing effect for stress generation at the interface between each of the glass substrates 2 and 3 and each of the reacted layers 11. The ratio of D1/D2 is preferably at least 2.0.

The sealing layer has portions with the reacted layers 11 formed therein such that each of the portions preferably has a cross-sectional area of at least 50 μm². In Description, the cross-sectional area means a cross-sectional area spreading in a width direction and in a vertical direction of the sealing layer 8 having the reacted layers 11 formed therein. When each of the reacted layer 11 has a cross-sectional area of at least 50 µm², it is possible to more firmly bond the glass substrates 2 and 3 to the sealing layer 8. Each of the reacted layers 11 has a cross-sectional area of preferably at least 100 µm². The cross-sectional area of the reacted layers 11 may be increased according to e.g. the shape of the reacted layers (such as depth). The cross-sectional areas of the reacted layers 11 may be increased by enlarging the width (line width) of the sealing layer 8, which is also an example of the measures to enhance the bonding strength between the glass substrates 2 and 3 and the sealing layer 8. It should be noted that the width (line width) of the sealing layer 8 is restricted based on the structure or the like of the electronic device 1, specifically that the width is preferably at least 0.2 mm and at most 1.5 mm.

Although the generation of the reacted layers can be confirmed by observing portions of the glass substrates 2 and 3 and the sealing layer 8 in the vicinity of the bonding interfaces to composition profile analysis by use of EE-EPMA, the following method is a practical method. In Description, the values measured by the following method will be shown with respect to the shape of the reacted layers 11 (such as the depth, the cross-sectional area and the ratio of D1/D2).

First, a portion of a sealed electronic device (glass panel constituted by glass substrates 2 and 3 and a sealing layer 8) 1 is cut out to obtain a sample, which can be easily ground. One of the glass substrates is removed from the sample by grinding. If peeling occurs in the sealing layer 8 due to low bonding strength, the step for grinding the one glass substrate may be omitted. Next, the sample, which has had the one glass substrate removed therefrom, is immersed in an etching solution to remove the sealing layer. The etching solution is an acid solution which is capable of dissolving the constituent elements of sealing glass. For example, when the sealing glass is bismuth glass, a 30% nitric acid aqueous solution is used for example. Since the reacted layers 11 are mixed layers constituted by constituent element which are of the same kinds as the glass substrates 2 and 3 and as the sealing glass, the relevant reacted layer 11 is also removed at the same time that the sealing layer 8 is removed.

Figure 10:
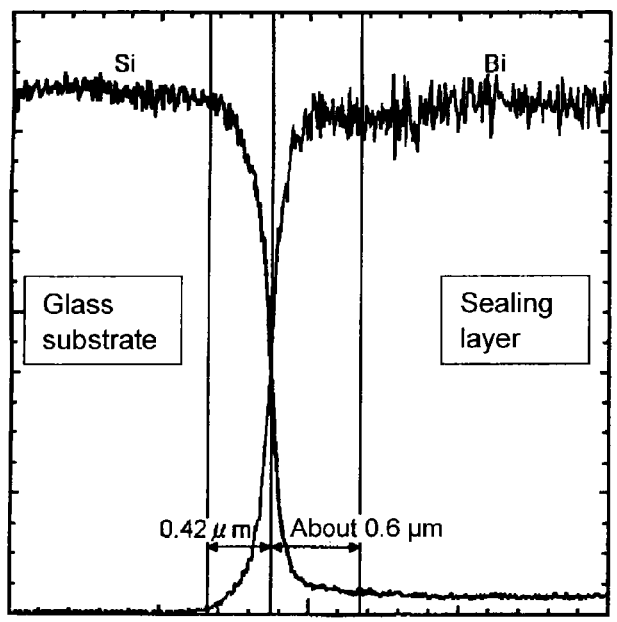
FIG. 10 is a graph illustrating composition profile analysis results in the vicinity of the interface between a glass substrate and a sealing material layer before sealing in Example 5.
Figure 11:
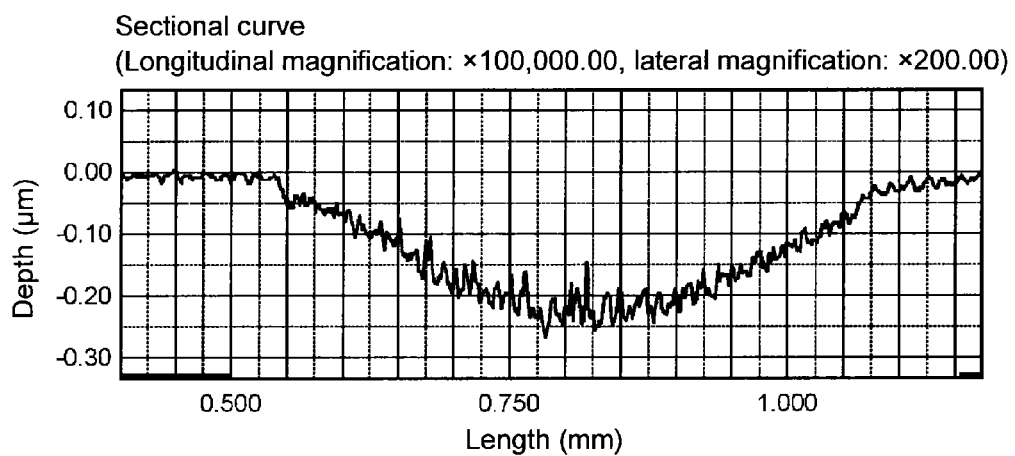
FIG. 11 is a graph illustrating results obtained by measuring the surface shape of the trace of a reacted layer formed in a glass substrate and in the vicinity of the trace after sealing in the glass panel fabricated in Example 6.

In this manner, a glass substrate, where the formation trace of the relevant reacted layer 11 remains as a concave portion, is fabricated. By using a surface roughness meter to measure the surface shape of the glass substrate having such a concave portion, it is possible to measure and evaluate the shape of the concave portion as the formation trace of the reacted layer 11, i.e. the shape of the reacted layer 11. FIG. 10 is a graph illustrating results obtained by measuring the surface shape of the formation trace of the reacted layer 11 of a glass substrate in the glass panel fabricated in Example 5 described layer, and FIG. 11 is a graph illustrating results obtained by measuring the surface shape of the formation trace of the reacted layer 11 of a glass substrate in the glass panel fabricated in Example 8 described later. As shown in these Figures, it is possible to evaluate the shape of the reacted layers 11 by measuring the surface shapes of the glass substrates 2 and 3 by use of such a surface roughness meter after the reacted layers 11 have been removed from the glass substrates 2 and 3 by melting.

The reacted layers 11 having the above-mentioned shape can be produced with high reproducibility by controlling e.g. the composition of the sealing glass or the heating temperature for the sealing material layer 9 by irradiation of laser light or an electromagnetic wave. Specifically, when bismuth glass is applied to the sealing glass (glass frit), such glass preferably has a composition of 70 to 90% of $Bi_2O_3$, 1 to 20% of ZnO, 2 to 12% of $B_2O_3$ and 10 to 380 ppm of $Na_2O$ by mass proportion. Glass constituted by such three components of $Bi_2O_3$, ZnO and $B_2O_3$ is appropriate as glass components for the sealing material used for local heating because of being transparent and having favorable properties, such as a low glass-transition point. It should be noted that it is likely that the sealing glass constituted by the above-mentioned three components fails to sufficiently produce the reacted layers 11 between the glass substrates 2 and 3 and the sealing layer 8.

In order that the reacted layers 11 are formed at the bonding interfaces between the glass substrates 2 and 3 and the sealing layer 8 so as to have a required function, it is effective to incorporate an easy-to-disperse element, specifically a monovalent alkali metal element in the glass frit. In particular, it is effective to incorporate $Na_2O$ in a bismuth glass frit. By using a four-component glass frit obtained by incorporating a suitable amount of $Na_2O$ in such a bismuth glass frit constituted by these three components of $Bi_2O_3$, ZnO and $B_2O_3$, the reacted layers 11 can be easily generated at the bonding interfaces between the glass substrates 2 and 3 and the sealing layer 8.

In the above-mentioned bismuth glass frit constituted by these four components, $Bi_2O_3$ is a component for forming a glass mesh and is preferably incorporated in the sealing glass in a range of 70 to 90 mass %. When the content of $Bi_2O_3$ is less than 70 mass %, the softening temperature of the glass frit is raised. When the content of $Bi_2O_3$ exceeds 90 mass %, vitrification is unlikely to occur whereby glass production becomes difficult and thermal expansion coefficient trends to be extraordinarily high. The content of $Bi_2O_3$ is preferably in a range of 78 to 87 mass %, taking into account the sealing temperature or the like.

Since ZnO is a component to lower the thermal expansion coefficient or the softening temperature, ZnO is preferably incorporated in the sealing glass in a range of 1 to 20 mass %. When the content of ZnO is less than 1 mass %, vitrification becomes difficult. The content of ZnO exceeds 20 mass %, the stability during forming low temperature melting glass is deteriorated, whereby it is unlikely to obtain glass since devitrification easily occurs. The content of ZnO is preferably in a range of 7 to 12 mass %, taking into account the stability of glass production or the like.

$B_2O_3$ is a component to form a glass skeleton and to increase a range where vitrification can be established, and is preferably incorporated in the sealing glass in a range of 2 to 12 mass %. When the content of $B_2O_3$ is less than 2 mass %, vitrification becomes difficult. The content of $B_2O_3$ exceeds 12 mass %, the softening point is raised. The content of $B_2O_3$ is preferably in a range of 5 to 10 mass %, taking into account the stability of glass, the sealing temperature or the like.

$Na_2O$ is a component to increase the reactivity between the glass substrates 2 and 3 and the sealing layer 8 and is preferably incorporated in the sealing glass in a range of 10 to 380 ppm by mass proportion. When the content of $Na_2O$ is less than 10 mass ppm, it is impossible to sufficiently increase the generation efficiency of the reacted layers 11. On the other hand, when the content of $Na_2O$ exceeds 380 mass ppm, it is likely to have an adverse effect on wiring or the like formed on the first glass substrate 2. An excessive amount of $Na_2O$ is likely to react with the wiring formed on the first glass substrate 2 for having functions as an electronic device, whereby disconnection or the like occurs in the wiring. When the content of $Na_2O$ is too much, the stability of glass is deteriorated, and devitrification is likely to occur. The content of $Na_2O$ is preferably in a range of 100 to 350 ppm by mass proportion, taking into account improvement in the bonding strength between the glass substrates 2 and 3 and the sealing layer 8, adverse effect on the wiring or the like, the stability of glass etc.

In the same manner as the above-mentioned $Na_2O$, another alkaline metal oxide, such as $Li_2O$ or $K_2O$, also functions as components for forming the reacted layers 11 on the bonding interface between the glass substrates 2 and 3 and the sealing layer 4. These alkaline metal oxides to be added to the sealing glass are preferably to be contained in the sealing glass in a total content in a range of 10 to 380 ppm by mass proportion. However, among these alkaline metal oxides, $Na_2O$, which is particularly excellent in reactivity with the glass substrates 2 and 3, is effective, and accordingly, bismuth glass used as a glass frit preferably contains $Na_2O$. A part of $Na_2O$ may be substituted by at least one member selected from $Li_2O$ and $K_2O$. The amount of $Na_2O$ substituted by $Li_2O$ or $K_2O$ is preferably at least 50 mass % of the amount of $Na_2O$, considering e.g. the formation of the reacted layers 11 on the bonding interfaces.

Bismuth glass constituted by the above four components has a low glass transition point and is suitable as the sealing material. The bismuth glass may contain one or plural optional components, such as $Al_2O_3$, $CeO_2$, $SiO_2$, $Ag_2O$, $WO_3$, $MoO_3$, $Nb_2O_3$, $Ta_2O_5$, $Ga_2O_3$, $Sb_2O_3$, $Cs_2O$, $CaO$, $SrO$, $BaO$, $P_2O_5$ or $SnO_x$ (x is 1 or 2). However, when the content of such an optional component is too high, the glass becomes unstable, and devitrification may occur, or the glass transition point or the softening point may become high. Accordingly, the total content of such optional components is preferably at most 10 mass %. The lower limit of the total content of the optional components is not particularly limited. Bismuth glass (glass frit) may contain an optional component in an effective amount according to the purpose of addition.

Among the above optional components, $Al_2O_3$, $SiO_2$, $CaO$, $SrO$, $BaO$, etc. are components contributing to stabilization of glass, and its content is preferably in a range of 0 to 5 mass %. $Cs_2O$ has a function of lowering the softening temperature of glass, and $CeO_2$ has an effect of stabilizing the fluidity of glass. $Ag_2O$, $WO_3$, $MoO_3$, $Nb_2O_3$, $Ta_2O_5$, $Ga_2O_3$, $Sb_2O_3$, $P_2O_5$, $SnO_x$ etc. may be contained as components for adjusting e.g. the viscosity or the thermal expansion coefficient of glass. The content of these components may be appropriately selected within a range wherein the total content does not exceed 10 mass % (containing 0 mass %).

Although explanation has been made about a case where the sealing glass is bismuth glass, the sealing glass as the main component of the sealing material is not limited to bismuth glass. For example, the sealing glass may contain, as its main components, 70 to 85% of $Bi_2O_3$, 3 to 20% of ZnO, 2 to 12% of $B_2O_3$, 0.1 to 10% of BaO and 10 to 380 ppm of $Na_2O$ by mass percentage, for example. Even in a case where the sealing glass is other than bismuth glass, the reacted layers 11 may be produced in the glass substrates 2 and 3 due to reaction with the sealing layer 8 by incorporation of a component to increase the reactivity with the glass substrates 2 and 3 (such as a component made of an alkaline metal oxide). Borosilicate-alkali glass is exemplified. Further, it is possible to increase the generation efficiency of the reacted layers 11 by application of the heating conditions for the sealing material layer 9 as described below.

With regard to the heating conditions for the sealing material layer 9, the sealing material 9 is irradiated with the electromagnetic wave 10 such that when the sealing glass has a softening temperature of T (° C.), the sealing material layer 9 is heated at a temperature of at least (T+200° C.) to at most (T+800° C.). In other words, it is possible to increase the reactivity between the glass substrates 2 and 3 and the sealing glass by heating the sealing material layer 9 at a temperature of at least 200° C. higher than the softening temperature T (° C.) of the sealing glass. However, when the sealing material layer 9 is heated at a temperature exceeding (T+800° C.), it is likely that e.g. cracks or fractures are caused in the glass substrates 2 and 3. The sealing material layer 9 is more preferably heated at a temperature in a range of at least (T+300° C.) to at most (T+500° C.). In Description, the heating temperature by laser light was measured by a radiation thermometer (manufactured by Hamamatsu Photonics K.K. and available under the name of LD-HEATER L10060).

The electronic device 1 according to this embodiment may be fabricated as described below for example. First, as shown in FIG. 2(a), the first glass substrate 2 with the electronic element portion 4 and the second glass substrate 3 with the sealing material layer 9 are prepared. The sealing material layer 9 may be formed in such a way that a sealing material containing sealing glass, a low-expansion filler and a laser absorbent is mixed with a vehicle to prepare sealing material paste, and the sealing material paste is applied to the sealing region 7 to the second glass substrate 3, followed by being dried and fired.

The vehicle, which is used for preparing the sealing material paste, may, for example, be one having a resin, such as methyl cellulose, ethyl cellulose, carboxymethyl cellulose, oxyethyl cellulose, benzyl cellulose, propyl cellulose, nitrocellulose or the like dissolved in a solvent, such as terpineol, butyl carbitol acetate or ethyl carbitol acetate, or one having an acrylic resin, such as methyl (meth)acrylate, ethyl (meth) acrylate, butyl (meth)acrylate or 2-hydroxyethyl methacrylate dissolved in a solvent, such as methyl ethyl ketone, terpineol, butyl carbitol acetate or ethyl carbitol acetate.

The viscosity of the sealing material paste may be fitted to the viscosity in accordance with an apparatus which applies the paste on the glass substrate 3, and may be adjusted by the ratio of the resin (binder component) to the solvent or the ratio of the sealing material to the vehicle. To the sealing material paste, known additives for glass paste, such as a solvent for dilution, an antifoaming agent or a dispersing agent may be added. For preparation of the sealing material paste, a known method employing a rotary mixer equipped with a stirring blade, a roll mill, a ball mill or the like may be applied.

The sealing material paste is applied on the sealing region 7 of the second glass substrate 3, and the paste is dried to form a coating layer of the sealing material paste. The sealing material paste may be applied on the second sealing region 7 by employing, for example, a printing method, such as screen printing or gravure printing, or be applied along the second sealing region 7 by using a dispenser or the like. The coating layer of the sealing material paste is dried, for example, at a temperature of preferably at least 120° C. for preferably at least 10 minutes. The drying step is carried out to remove the solvent in the coating layer. If the solvent remains in the coating layer, the binder component may be insufficiently removed in the following firing step.

The above coating layer of the sealing material paste is fired to form the sealing material layer 9. In the firing step, first, the coating layer is heated to a temperature of at most the glass transition point of the sealing glass (glass frit) as the main component of the sealing material to remove the binder component in the coating layer, and then heated to a temperature of at least the softening point of the sealing glass (glass frit) to melt the sealing material and bake it on the glass substrate 3. In such a manner, the sealing material layer 9 is formed so as to be constituted by the fired layer of the sealing material. When the sealing material paste is applied in a line pattern on the sealing region 7 of the second glass substrate, the thickness and the width of the line pattern are selected such that the sealing layer 8 has a thickness of 2 to 15 μm and a width of 0.2 to 1.5 mm.

Then, as shown in FIG. 2(b), the first glass substrate 2 and the second glass substrate 3 are laminated such that the surface 2a of the first glass substrate with the electronic element portion 4 thereon and the surface 3a of the second glass substrate with the sealing material layer 9 thereon face each other. After that, as shown in FIG. 2(c), the sealing material 9 is irradiated with the electromagnetic wave 10, such as laser light or infrared light, through the second glass substrate 3. Although not shown in FIGS. 2(a) to (d), the sealing material layer 9 may be irradiated with the electromagnetic wave 10, such as laser light or infrared light, through the first glass substrate 2, or the sealing material layer 9 may be irradiated with the electromagnetic wave 10, such as laser light or infrared light, through the first and second glass substrates from both sides of the first and second glass substrates. When laser light is used as the electromagnetic wave 10 for irradiation of the sealing material layer 9, the sealing material layer 9, which is formed in a frame shape on a peripheral portion of the second glass substrate, is irradiated with the laser light while the laser light is scanning along the sealing material layer. The laser light is not particularly limited, and the laser light may be one emitted from a semiconductor laser, a carbon dioxide laser, an eximer laser, a YAG laser or a HeNe laser. When infrared light is used as the electromagnetic wave, it is preferred that the sealing material layer 9 be selectively irradiated with the infrared light such that a portion of the second glass substrate without the sealing material layer 9 is masked with e.g. an infrared light reflection film made of Ag or the like.

When the sealing glass has a softening point temperature of T (° C.), the sealing material layer 9 is preferably heated at a temperature in a range of at least (T+200° C.) to at most (T+800° C.) by the electromagnetic wave 10, such as laser light or infrared light as described above. In order to meet with such a heating condition, the electromagnetic wave 10 is preferably laser light having an output density in a range of 250 to 10,000 W/cm$^2$ or infrared light having an output in a range of 1 to 30 kW. The electromagnetic wave is more preferably laser light having an output density in a range of 1,000 to 8,000 W/cm$^2$ or infrared light having an output in a range of 5 to 25 kW. The temperature for heating the sealing material layer 9 by irradiation of laser light or infrared light varies, depending on the thickness or the line width of the sealing material layer 9, scanning speed in the case of laser light, or another factor. Accordingly, taking into these conditions, the irradiation conditions by the laser light or infrared light are preferably set such that the heating temperature for the sealing material layer 9 is in the above-mentioned range.

When laser light is used as the electromagnetic wave 10, the sealing material layer 9 is sequentially melted from a part irradiated with the laser light scanning along the sealing material layer and is quenched and solidified upon completion of irradiation with the laser light and is bonded to the first glass substrate 2. By irradiating the entire sealing material layer 9 with the laser light, the sealing layer 8 is formed to seal the space between the first glass substrate 2 and the second glass substrate 3 as shown in FIG. 2(d). When infrared light is used as the electromagnetic wave 10, the sealing material layer 9 is melted by irradiation with the infrared light, and is quenched and solidified upon completion of irradiation with the infrared light, and is fixed to the first glass substrate 2. In that manner, the sealing layer 8 is formed so as to seal the space between the first glass substrate 2 and the second glass substrate 3 as shown in FIG. 2(d).

When the sealing material layer 9 is irradiated with the electromagnetic wave 10, such as laser light or infrared light, only the sealing material layer 9 is locally heated. Although the heat given to the sealing material layer 9 is diffused outside through the glass substrates 2 and 3, a portion of the sealing material layer 9 in the vicinity of the center thereof has a lower heat-transfer efficiency than a portion of the sealing material layer in the vicinity of an edge portion thereof. For this reason, the reaction between the glass substrates 2 and 3 and the sealing glass is likely to progress in such a portion of the sealing material layer 9 in the vicinity of the center thereof where heat is difficult to escape. Accordingly, when local heating by use of laser light or infrared light is applied, the reacted layers 11 are likely to be formed in a shape as shown in FIG. 7 or FIG. 8. Further, when laser light is used as the electromagnetic wave 10, it is preferred to use laser light having an intensity distribution in a protruded shape, whereby the reacted layers 11 are also likely to be formed in a protruded shape.

In such a manner, the electronic device 1, which has the electronic element portion 4 formed between the first glass substrate 2 and the second glass substrate 3 and hermetically sealed in the glass panel constituted by the first glass substrate, the second glass substrate and the sealing layer 8, is fabricated. The reliability of the electronic device 1 depends on e.g. the bonding strength between the glass substrates 2 and 3 and the sealing layer 8. According to this embodiment, it is possible to provide the electronic device 1 with an excellent reliability since it is possible to increase the bonding strength between the glass substrates 2 and 3 and the sealing layer 8. It should be noted that the glass panel, the interior of which is hermetically sealed, is not limited to the electronic device 1, and can be applied to a sealed product of an electronic component or a glass member (e.g. a building material), such as a double-glazing unit.

EXAMPLES

Now, the present invention will be described in detail with reference to specific Examples and evaluation results thereof. However, it should be understood that the present invention is by no means restricted to the following specific Examples, and modification within the scope of the present invention is possible.

Example 1

First, a bismuth glass frit (softening point: 420° C.) having a composition including 83% of $Bi_2O_3$, 5.5% of $B_2O_3$, 11% of ZnO and 0.5% of $Al_2O_3$ by mass proportion, and further including 12 ppm of $Na_2O$ by mass proportion, cordierite powder as a low-expansion filler, and a laser absorbent, as an electromagnetic wave absorption material, having a composition including 24% of $Fe_2O_3$, 22% of CuO, 20% of $Al_2O_3$ and 34% of MnO by mass proportion were prepared. The content of $Na_2O$ was analyzed by ICP. Although the total amount of the main components is represented as 100 mass % with regard to the composition ratio of the bismuth glass frit for descriptive purposes, the amount of $Na_2O$ as a minor component is contained in the total of the components of the sealing glass (100 mass %).

68 vol % of the bismuth glass frit, 25 vol % of the cordierite powder and 7 vol % of the laser absorbent were mixed to prepare a sealing material (thermal expansion coefficient: $71 \times 10^{-7}$/° C.). By mixing 84 mass % of this sealing material with 16 mass % of a vehicle which was prepared by dissolving 5 mass % of ethyl cellulose as a binder component in 95 mass % of 2,2,4-trimethyl-1,3-pentanediol monoisobutyrate, sealing paste was prepared. Then, a second glass substrate (thickness: 0.7 mm, dimensions: 90 mm by 90 mm), which was constituted by alkali-free glass (manufactured by Asahi Glass Company, Limited and commercially available under the name of AN100 (thermal expansion coefficient: $38 \times 10^{-7}/°$ C.) was prepared, and the sealing material paste was applied on a sealing region on this glass substrate by a screen printing method, followed by being dried at 120° C. for 10 minutes. The resulting coating layer was fired at 480° C. for 10 minutes to form a sealing material layer having a film thickness 10 μm and a line width of 0.5 mm.

Next, the second glass substrate having the sealing material layer and a first glass substrate (substrate of alkali-free glass having the same composition and the same shape as those of the second glass substrate) having an element-formed region (a region on which an OEL element was formed) were laminated. Then, the sealing material layer was melted and quenched to be solidified in order to seal the first glass substrate and the second glass substrate by being irradiated with laser light (semiconductor laser) having a wavelength of 940 nm and a spot diameter of 1.6 mm at an output of 23.5 W (output density: 1,169 W/cm$^2$) at a scanning rate of 10 mm/s through the second glass substrate. The used laser light had a strength distribution which is not uniform and is formed in a protruded shape.

When the heating temperature for the sealing material layer during irradiation of the laser light was measured by the radiation thermometer, it was revealed that the sealing material layer had a temperature of 650° C. Since the above-mentioned bismuth glass frit has a softening point temperature T of 420° C., the heating temperature for the sealing material layer corresponds to (T+230° C.). An electronic device having the glass panel thus fabricated was subjected to property evaluation, which will be described later.

Example 2

The formation of a sealing material layer and the sealing of a first glass substrate and a second glass substrate by use of laser light were carried out in the same manner as in Example 1 except that a bismuth glass frit containing 100 ppm of Na$_2$O by mass proportion (softening point: 420° C.) was used. The sealing material layer had a temperature of 650° C. during irradiation of the laser light as in Example 1. An electronic device having the glass panel thus fabricated was subjected to the property evaluation described later.

Example 3

The formation of a sealing material layer and the sealing of a first glass substrate and a second glass substrate by use of laser light were carried out in the same manner as in Example 2 except that the laser light had an output of 28 W (output density: 1,393 W/cm$^2$). The sealing material layer had a temperature of 730° C. during irradiation of the laser light. This heating temperature corresponds to (T+310° C.). An electronic device having the glass panel thus fabricated was subjected to the property evaluation described later.

Example 4

The formation of a sealing material layer and the sealing of a first glass substrate and a second glass substrate by use of laser light were carried out in the same manner as in Example 2 except that the laser light had an output of 32 W (output density: 1,592 W/cm$^2$). The sealing material layer had a temperature of 790° C. during irradiation of the laser light. This heating temperature corresponds to (T+370° C.). An electronic device having an element-formed region sealed in the glass panel in such a manner was subjected to the property evaluation described later.

Example 5

The formation of a sealing material layer and the sealing of a first glass substrate and a second glass substrate by use of laser light were carried out in the same manner as in Example 2 except the laser light had an output of 37 W (output density: 1,847 W/cm$^2$). The sealing material layer had a temperature of 900° C. during irradiation of the laser light. This heating temperature corresponds to (T+480° C.). An electronic device having an element-formed region sealed in the glass panel in such a manner was subjected to the property evaluation described later.

Example 6

The formation of a sealing material layer and the sealing of a first glass substrate and a second glass substrate by use of laser light were carried out in the same manner as in Example 4 except that the sealing material layer had a line width of 0.75 mm and the laser light had an output of 28 W (output density: 1,393 W/cm$^2$). The sealing material layer had a temperature of 790° C. during irradiation of the laser light as in Example 4. An electronic device having the glass panel thus fabricated was subjected to the property evaluation described later.

Example 7

The formation of a sealing material layer and the sealing of a first glass substrate and a second glass substrate by use of laser light were carried out in the same manner as in Example 3 except that the sealing material layer had a line width of 1 mm and that the laser light had an output of 25 W (output density: 1,244 W/cm$^2$). The heating material layer had a temperature of 740° C. during irradiation of the laser light. This heating temperature corresponds to (T+320° C.). An electronic device having the glass panel thus fabricated was subjected to the property evaluation described later.

Example 8

The same material paste was prepared in the same manner as in Example 1 except that a bismuth glass frit (softening point: 420° C.) containing 350 ppm of Na$_2$O by mass proportion was used. The sealing material paste containing this bismuth glass frit was applied on a sealing region on a second glass substrate (thickness: 0.7 mm, dimensions: 90 mm by 90 mm) made of soda lime glass (manufactured by Asahi Glass Company, Limited and having a thermal expansion coefficient of $84 \times 10^{-7}/°$ C.) by a screen printing method, followed by being dried at 120° C. for 10 minutes. The resulting coating layer was fired at 480° C. for 10 minutes to form a sealing material layer having a film thickness of 10 μm and a line width of 1 mm.

Next, the second glass substrate having the sealing material layer and a first glass substrate (a substrate constituted by soda lime glass having the same composition and the same shape as those of the second glass substrate) having an element-formed region were laminated. Then, the sealing material layer was melted and quenched to be solidified in order to seal the first glass substrate and the second glass substrate by irradiated with laser light (semiconductor laser) having a wavelength of 940 nm and a spot diameter of 1.6 mm at an output of 18 W (output density: 896 W/cm$^2$) at a scanning rate of 5 mm/s through the second glass substrate. The used laser light had a strength distribution which is not uniform and is formed in a protruded shape.

When the heating temperature of the sealing material layer during irradiation of the laser light was measured by the radiation thermometer, it was revealed that the sealing material layer had a temperature of 620° C. Since the above-mentioned bismuth glass frit has a softening point temperature T of 420° C., the heating temperature of the sealing material layer corresponds to (T+200° C.). An electronic device having the glass panel thus fabricated was subjected to the property evaluation described later.

Example 9

With the content of $Na_2O$ in a bismuth glass frit being the same as that in Example 2, and with the other conditions being the same as those in Example 1, a sealing material layer having a film thickness of 10 μm and a line width of 0.5 mm was formed in a sealing region on a second glass substrate of alkali-free glass. Next, the second glass substrate having the sealing material layer and a first glass substrate (substrate of alkali-free glass having the same composition and the same shape as those of the second glass substrate) were laminated. The sealing material layer was melted and quenched to be solidified in order to seal the first glass substrate and the second glass substrate by being disposed in an infrared heating system having an output of 10 to 20 kW.

When the temperature of part of glass in the vicinity of the sealing material layer during irradiation of infrared light was measured by a thermocouple, the sealing material layer had a temperature of 900° C. Since the above-mentioned bismuth glass frit has a softening point temperature T of 420° C., the heating temperature of the sealing material layer corresponds to (T+480° C.). An electronic device having the glass panel thus fabricated was subjected to the property evaluation described later.

In Examples 1 to 9, the thicknesses and the line width of the sealing layers that were formed by heating the obtained sealing material layers by irradiation of the electromagnetic waves were the same as those of the sealing material layers, which means that there were no changes.

Comparative Example 1

The formation of a sealing material layer and the sealing of a first glass substrate and a second glass substrate by use of laser light were carried out in the same manner as in Example 1 except that the laser light had an output of 13 W (output density: 647 W/cm$^2$). The sealing material layer had a temperature of 540° C. during irradiation of the laser light. This heating temperature corresponds to (T+120° C.). An electronic device having the glass panel thus fabricated was subjected to the property evaluation described later.

Comparative Example 2

Figure 9:
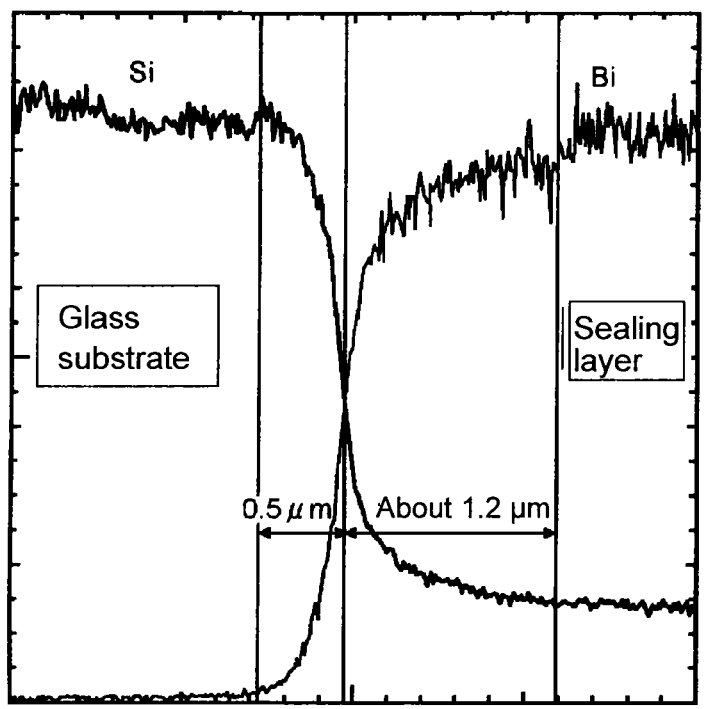
FIG. 9 is a graph illustrating composition profile analysis results in the vicinity of the interface between a glass substrate and a sealing layer after sealing in Example 5.

The formation of a sealing material layer and the sealing of a first glass substrate and a second glass substrate by use of laser light were carried out in the same manner as in Example 1 except that a bismuth glass frit (softening point: 420° C.) containing 4 ppm of $Na_2O$ by mass proportion was used. The sealing material layer had a temperature of 650° C. during irradiation of the laser light as in Example 1. An electronic device having the glass panel thus fabricated was subjected to the property evaluation described later. With respect to the above-mentioned glass panels fabricated in Examples 1 to 9, an optical microscope (100 times magnification) was used to check out whether the bonding was completed or not. It was revealed that all panels were bonded. Further, with respect to the glass panel fabricated in Example 5, a portion of the glass panel in the vicinity of the bonding interface between a glass substrate and the sealing layer was observed by cross-sectional SEM, and composition profile analysis was carried out for Si as a main constituent element of the glass substrate and Bi as a main constituent element of the sealing layer by FE-EPMA. The composition profile analysis results for Si and Bi of the glass panel in Example 5 are shown in FIG. 9. Further, a portion of the glass panel in the vicinity of the interface of the glass substrate and the sealing material layer before laser sealing was observed by the cross-sectional SEM, and composition profile analysis was carried out for Si of the constituent element of the glass substrate and Bi as the main constituent element of the sealing layer by FE-EPMA. The results are shown in FIG. 10. As clearly seen from comparison of FIG. 9 and FIG. 10, it was revealed that Si and Bi were mixed to produce a reacted layer in the vicinity of the interface.

Figure 14:
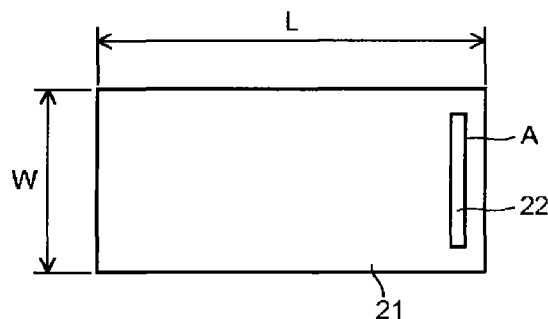
FIG. 14 is a schematic view illustrating a glass substrate used to fabricate a sample for measuring bonding strength and the shape of a reacted layer.
Figure 15:
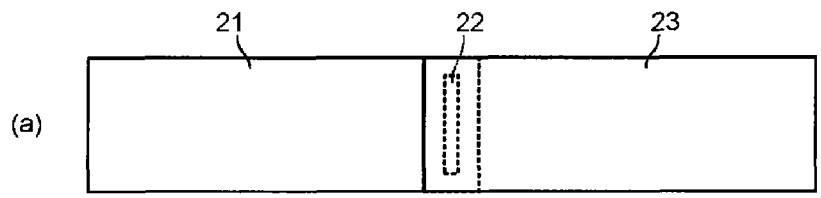
FIG. 15 is a schematic view illustrating such a sample for measuring bonding strength and the shape of the reacted layer.
Figure 15:
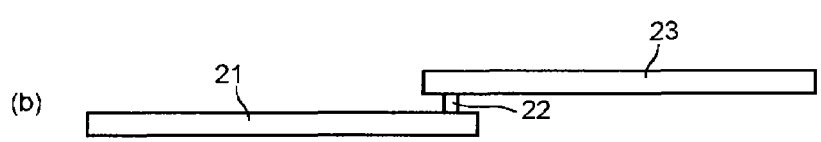

Next, in order to measure the shape and the bonding strength of reacted layers, samples were prepared under the same conditions as Examples 1 to 9 and Comparative Examples 1 and 2, respectively, except that glass substrates were different from those in Examples 1 to 9 and Comparative Examples 1 and 2 in terms of only the dimensions of the glass substrates and sealing regions. The samples were fabricated as described below. The glass substrates had a thickness of 0.7 mm and dimensions of 70 mm long and 25 mm wide. In each case, a sealing material layer 22 was first formed in a sealing region A on a glass substrate 21 as shown in FIG. 14, and the glass substrate 21 and the other glass substrate 23 were partly overlapped as shown in FIG. 15, followed by being sealed under the same conditions as Examples 1 to 9 and Comparative Examples 1 and 2, respectively. The bonding strengths of such samples were measured by reference to JIS K6856 (TESTING METHODS FOR FLEXURAL STRENGTH OF ADHESIVE BONDS). The measurements were different from JIS K6856 in that the thicknesses of the substrates changed from 2.8 mm to 0.7 mm and that the sealing widths of the substrates changed from 12.5 mm to values corresponding to those of respective Examples and Comparative Examples. The measurement results of the bonding strengths are shown in Tables 1 and 2.

Figure 16:
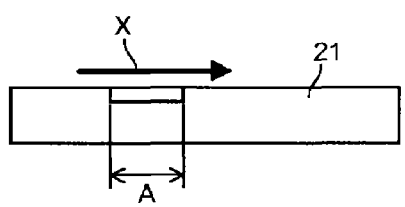
FIG. 16 is a schematic view illustrating how to measure the shape of the reacted layer.

The shapes of the reacted layers were measured according to the above-mentioned method for measuring glass substrates (method for measuring the surface shapes of the glass substrates by a surface roughness meter after the reacted layers were removed). The samples are described above. Each specimen was prepared by cutting out a portion of the glass substrates in each sample by a dicer for easy grinding. One of the glass substrates in each specimen was removed by being ground by a surface grinder with abrasive powder (manufacture by Fujimi Incorporated and commercially available under the name of FO#500) being used. In this grinding operation, sufficient care was taken such that the glass substrates to remove did not remain and that the glass substrates for the specimens were not ground. When peeling was caused in the sealing layers because of having a low bonding strength, it was possible to avoid the grinding process of the glass substrates. Next, an etching solution was prepared by diluting a nitric acid aqueous solution (60%) with distilled water in a ratio of 1:1. Each specimen, where the other substrate was removed, was immersed in the etching solution for 2 hours. Then, the specimens were cleaned by the distilled water and were dried at 120° C. in a dryer for 5 minutes. The surface state of the sealing region of each specimen was measured by a contact-type surface roughness meter (manufactured by TOKYO SEIMITSU CO., LTD. and commercially available under the name "SURFCOM 1400D") as shown in FIG. 16.

Figure 12:
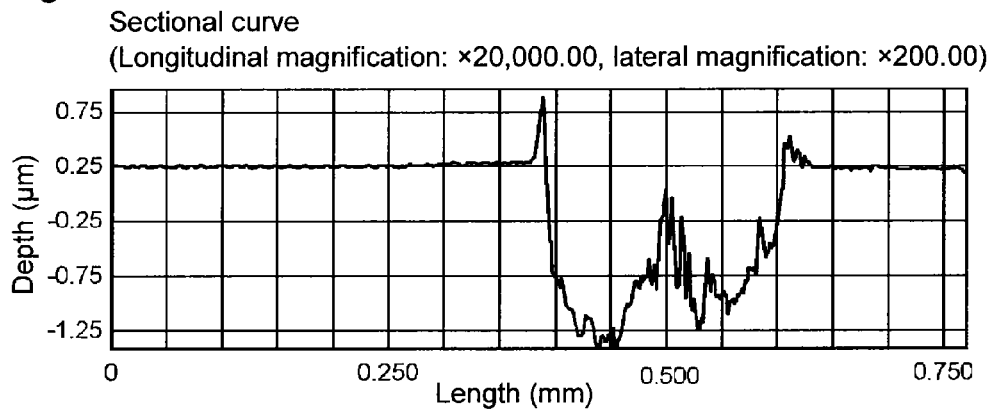
FIG. 12 is a graph illustrating results obtained by measuring the surface shape of the trace of a reacted layer formed in a glass substrate and in the vicinity of the trace after sealing in the glass panel fabricated in Example 9.
Figure 13:
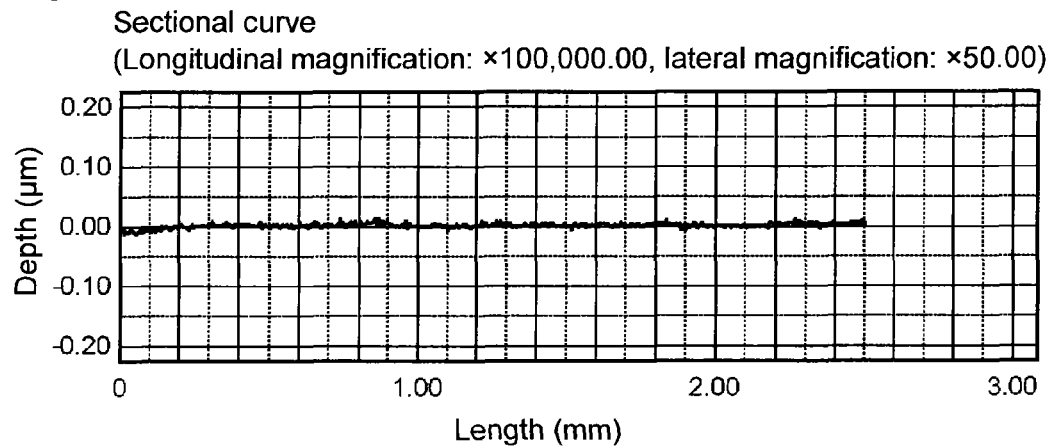
FIG. 13 is a graph illustrating results obtained by measuring the surface shape of a formation region of a reacted layer of a glass substrate and in the vicinity of the formation region after sealing in the glass panel fabricated in Comparative Example 1.

FIG. 11 illustrates the results obtained by measuring the surface shape of the trace of the reacted layer formed in the glass substrate and in the vicinity of the trace in the glass panel fabricated in Example 6. Further, FIG. 12 illustrates the results obtained by measuring the surface shape of the trace of the reacted layer formed in the glass substrate and in the vicinity of the trace in the glass panel fabricated in Example 9, and FIG. 13 illustrates the results obtained by measuring the surface shape of the trace of the sealing layer of the glass substrate and in the vicinity of the trace in the glass panel fabricated in Comparative Example 1. The shape of the reacted layers were determined based on the surface measurement results of the glass substrates, and the maximum depth D1, the cross-sectional area and the ratio of D1/D2 of the reacted layers were found. These measurement/evaluation results are shown in Tables 1 and 2. In the Tables 1 and 2, the manufacturing conditions of the glass panels are also shown.

TABLE 1

|  |  | Ex. 1 | Ex. 2 | Ex. 3 | Ex. 4 | Ex. 5 | Ex. 6 |
|---|---|---|---|---|---|---|---|
| Glass substrate | | Alkali-free glass | | | | | |
| Glass frit | Amount of Na [ppm] | 12 | 100 | 100 | 100 | 100 | 100 |
| | Softening temperature [° C.] | 420 | 420 | 420 | 420 | 420 | 420 |
| | Line width of sealing material layer [mm] | 0.5 | 0.5 | 0.5 | 0.5 | 0.5 | 0.75 |
| | Heating method | Laser | Laser | Laser | Laser | Laser | Laser |
| Laser light | Output [W] | 23.5 | 23.5 | 28 | 32 | 37 | 28 |
| | Output density [W/cm$^2$] | 1,169 | 1,169 | 1,393 | 1,592 | 1,847 | 1,393 |
| | Scanning speed [mm/s] | 10 | 10 | 10 | 10 | 10 | 10 |
| Heating temperature for sealing material layer [° C.] | | 650 | 650 | 730 | 790 | 900 | 790 |
| (Heating temperature − softening temperature) [° C.] | | 230 | 230 | 310 | 370 | 480 | 370 |
| Shape of reacted layer | Shape | Protruded shape | Protruded shape | Protruded shape | Protruded shape | Protruded shape | Protruded shape |
| | Maximum depth [nm] | 45 | 60 | 150 | 300 | 400 | 280 |
| | Cross-sectional area [μm$^2$] | 9.7 | 12.5 | 52.5 | 80 | 150 | 130 |
| | D1/D2 | 2.5 | 4.6 | 6.0 | 6.0 | 7.0 | 7.0 |
| Bonding strength [N] | | 5.1 | 5.9 | 6.5 | 9.2 | 13.2 | 10.1 |

TABLE 2

|  |  | Ex. 7 | Ex. 8 | Ex. 9 | Comp. Ex. 1 | Comp. Ex. 2 |
|---|---|---|---|---|---|---|
| Glass substrate | | Alkali-free glass | Soda lime glass | Alkali-free glass | | |
| Glass frit | Amount of Na [ppm] | 100 | 350 | 100 | 12 | 4 |
| | Softening temperature [° C.] | 420 | 420 | 420 | 420 | 420 |
| | Line width of sealing material layer [mm] | 1 | 1 | 0.5 | 0.5 | 0.5 |
| | Heating method | Laser | Laser | Infrared light | Laser | Laser |
| Laser light | Output [W] | 25 | 18 | — | 13 | 23.5 |
| | Output density [W/cm$^2$] | 1,244 | 896 | — | 647 | 1,169 |
| | Scanning speed [mm/s] | 10 | 5 | — | 10 | 10 |
| Heating temperature for sealing material layer [° C.] | | 740 | 620 | 900 | 540 | 650 |
| (Heating temperature − softening temperature) [° C.] | | 320 | 200 | 480 | 120 | 230 |
| Shape of reacted layer | Shape | Protruded shape | Protruded shape | Protruded shape | (No reacted layer was produced) | (No reacted layer was produced) |
| | Maximum depth [nm] | 180 | 60 | 1,750 | 0 | 0 |
| | Cross-sectional area [μm$^2$] | 100 | 12.5 | 420 | 0 | 0 |
| | D1/D2 | 4.3 | 5.0 | 3.0 | — | — |
| Bonding strength [N] | | 5.8 | 7.1 | 12 | 2.5 | 3.4 |

As clearly shown in Tables 1 and 2, no reacted layer was produced in Examples 1 and 2, which means that the bonding strength was low due to the absence of the reacted layers. On the other hand, the glass panels in Examples 1 to 9 had the reacted layers produced so as to have a sufficient depth and shape, resulting in the achievement of good bonding strengths. Additionally, a first glass substrate and a second glass substrate having a sealing material layer formed, both of which were prepared as in Example 2, were laminated and were heated in a heating furnace at 500° C. for 1 hour. Although reacted layers were produced in the vicinity of bonding interfaces in this case, the reacted layer had a uniform depth (formed in a flat shape) since firing by the heating furnace was applied to this case.

Example 10

An electronic device was fabricated so as to have a glass panel formed in the same manner as in Example 1 except that a bismuth glass frit (softening point: 430° C.) having a composition including 79.3% of $Bi_2O_3$, 7.1% of $B_2O_3$, 7.6% of ZnO, 5.6% of BaO and 0.4% of $Al_2O_3$ by mass proportion, and further including 22 ppm of $Na_2O$ as mass proportion were used. The measurement result of the bonding strength was 6.0 N, which was revealed that the electronic device was firmly bonded. Although no verification was made for the reacted layer in this Example, it is estimated that the replacement of part of ZnO of the glass frit component by BaO reduces the potential of crystallization to improve the fluidity of glass, thereby forming excellent reacted layers.

Example 11

A bismuth glass frit, a low-expansion filler and a laser absorbent were prepared in the same manner as in Example 1. 74 vol % of the bismuth glass frit, 11 vol % of the cordierite powder and 15 vol % of the electromagnetic wave absorbent (laser absorbent) were mixed to prepare a sealing material (thermal expansion coefficient: $90 \times 10^{-7}/°C$.). By mixing 84 mass % of this sealing material with 16 mass % of a vehicle which was prepared, as a binder component, by dissolving 5 mass % of ethylcellulose in 95 mass % of 2,2,4-trimethyl-1,3 pentanediol monoisobutyrate, sealing paste was prepared. Then, a second glass substrate (thickness: 0.7 mm, dimensions: 90 mm by 90 mm), which was constituted by alkali-free glass (manufactured by Asahi Glass Company, Limited and commercially available under the name of AN100 (thermal expansion coefficient: $38 \times 10^{-7}/°C$.) was prepared, and the sealing material paste was applied on a sealing region on this glass substrate by a screen printing method, followed by being dried at 120° C. for 10 minutes. The resulting coating layer was fired at 480° C. for 10 minutes to form a sealing material layer having a film thickness 4 μm and a line width of 0.5 mm. Then, an electronic device was fabricated so as to have a glass panel formed under the same conditions as Example 3. The measurement result of the bonding strength was 7.0 N, which reveals that the electronic device was firmly bonded. Verification of the reacted layers shows that the reacted layers were formed in a protruded shape so as to have a maximum depth of 150 nm, a sectional area of 54 μm² and D1/D2 was 6.0.

INDUSTRIAL APPLICABILITY

In accordance with the present invention, it is possible to improve the bonding strength between glass substrates and a sealing layer in various kinds of electronic devices and to provide electronic devices having increased airtightness and durability with high reproducibility. The present invention is effective in electronic devices for e.g. FPDs, such as OELDs, PDPs and LCDs, solar cells and so on. Further, the present invention is also effective for hermetically sealing a reflective film by two glass substrates for protecting the reflective film in a reflective mirror for solar thermal power generation.

This application is a continuation of PCT Application No. PCT/JP2011/056627, filed on Mar. 18, 2011, which is based upon and claims the benefit of priority from Japanese Patent Application No. 2010-063839 filed on Mar. 19, 2010. The contents of those applications are incorporated herein by reference in its entirety.

REFERENCE SYMBOLS

1: electronic device, 2: first glass substrate, 3: second glass substrate, 4: electronic element portion, 5: element-formed region, 6: first sealing region, 7: second sealing region, 8: sealing layer, 9: sealing material layer, 10: electromagnetic wave, 11: reacted layer.

What is claimed is:

1. An electronic device comprising:
   a first glass substrate having a surface including a first sealing region;
   a second glass substrate having a surface, the surface including a second sealing region corresponding to the first sealing region and disposed so as to face the surface of the first glass substrate;
   an electronic element portion disposed between the first glass substrate and the second glass substrate; and
   a sealing layer formed between the first sealing region of the first glass substrate and the second sealing region of the second glass substrate so as to seal the electronic element portion;
   wherein the sealing layer comprises a melted and solidified layer which is obtained by locally heating a sealing material, the sealing material containing sealing glass, a low-expansion filler and an electromagnetic wave absorbent, and wherein reacted layers are produced in the first and second glass substrates by reaction with the sealing layer as a result of locally heating, each of the reacted layers having a maximum depth of at least 30 nm from an interface with the sealing layer,
   wherein the reacted layers have central portions formed in a shape protruding toward the first and second glass substrates in comparison with portions thereof in the vicinity of end portions,
   wherein said central portions and said end portions are relative to a width of said reacted layers.

2. The electronic device according to claim 1, wherein each of the reacted layers has a cross-sectional area of at least 50 μm².

3. The electronic device according to claim 1, wherein the sealing glass comprises bismuth glass containing 70 to 90% of $Bi_2O_3$, 1 to 20% of ZnO, 2 to 12% of $B_2O_3$, and 10 to 380 ppm of $Na_2 O$ by mass proportion.

4. The electronic device according to claim 1, wherein the electromagnetic wave absorbent comprises a compound containing at least one metal selected from a group consisting of Fe, Cr, Mn, Co, Ni and Cu, or a compound containing such metal, and the sealing material contains the electromagnetic wave absorbent in a range of 0.1 to 40% by volume proportion.

5. The electronic device according to claim 4, containing the electromagnetic wave absorbent in a range of 0.1 to 10% by volume proportion.

6. The electronic device according to claim 1, wherein the low-expansion filler comprises at least one member selected from the group consisting of silica, alumina, zirconia, zirconium silicate, aluminum titanate, mullite, cordierite, eucryptite, spodumene, a zirconium phosphate compound, a tin oxide compound and a silica solid solution, and the sealing material contains the low-expansion filler in a range of 1 to 50% by volume proportion.

7. The electronic device according to claim 1, containing the low-expansion filler in a range of 10 to 50% by volume proportion.

8. The electronic device according to claim 1, wherein the sealing layer has a thickness of 2 to 15 μm and a width of 0.2 to 1.5 mm.

9. A process for producing the electronic device of claim 1, comprising:
  preparing a first glass substrate having a surface including a first sealing region;
  preparing a second glass substrate having a surface including a second sealing region corresponding to the first sealing region, and a sealing material layer formed in the second sealing region, the sealing material layer comprising a fired layer of a sealing material containing sealing glass, a low-expansion filler and an electromagnetic wave absorbent, the sealing glass comprising bismuth glass containing 70 to 90% of $Bi_2O_3$, 1 to 20% of ZnO, 2 to 12% of $B_2O_3$, and 10 to 380 ppm of an alkaline metal oxide by mass proportion;
  laminating the first glass substrate and the second glass substrate through the sealing material layer with the surface of the first glass substrate and the surface of the second glass substrate facing each other; and
  irradiating the sealing material layer with an electromagnetic wave through the first glass substrate and/or the second glass substrate to locally heat the e sealing material layer such that when the sealing glass has a softening point temperature of T(° C.), the sealing material layer is heated at a temperature in a range of at least (T+200° C.) to at most (T+800° C.), whereby the sealing material layer is melted to form a sealing layer to seal an electronic element portion disposed between the first glass substrate and the second glass substrate.

10. The process according to claim 9, wherein the step for forming the sealing layer comprises producing layers reacted with the sealing layer in the first and second glass substrates such that each of the reacted layers has a maximum depth of at least 30 nm from an interface with the sealing layer.

11. The process according to claim 10, further comprising producing the reacted layers so as to have central portions formed in a shape protruding toward the first and second glass substrates in comparison with portions thereof in the vicinity of end portions.

12. The process according to claim 9, comprising irradiating the sealing material layer with laser light as the electromagnetic wave, the laser light having an output density in a range of 250 to 10,000 $W/cm^2$.

13. The process according to claim 9, comprising irradiating the sealing material layer with infrared light as the electromagnetic wave, the laser light having an output density in a range of 1 to 30 $kW/cm^2$.

14. The process according to claim 9, comprising wherein the bismuth glass in the sealing glass contains $Na_2O$ in a range of 100 to 350 ppm, and the sealing material layer is irradiated with the electromagnetic wave such that the sealing material layer is heated at a temperature in a range of at least (T+300° C.) to at most (T+500° C.).

15. A process for producing the electronic device of claim 1, comprising:
  preparing a first glass substrate having a surface including a first sealing region;
  preparing a second glass substrate having a surface including a second sealing region corresponding to the first sealing region, and a sealing material layer formed in the second sealing region, the sealing material layer comprising a fired layer of a sealing material containing sealing glass, a low-expansion filler and an electromagnetic wave absorbent, the sealing glass comprising bismuth glass containing 70 to 90% of $Bi_2O_3$, 1 to 20% of ZnO, 2 to 12% of $B_2O_3$, and 10 to 380 ppm of $Na_2O$ by mass proportion;
  laminating the first glass substrate and the second glass substrate through the sealing material layer with the surface of the first glass substrate and the surface of the second glass substrate facing each other; and
  irradiating the sealing material layer with an electromagnetic wave through the first glass substrate and/or the second glass substrate to locally heat the sealing material layer such that when the sealing glass has a softening point temperature of T(° C.), the sealing material layer is heated at a temperature in a range of at least (T+200° C.) to at most (T+800° C.), whereby the sealing material layer is melted to form a sealing layer to seal an electronic element portion disposed between the first glass substrate and the second glass substrate.

16. The process according to claim 15, wherein the step for forming the sealing layer comprises producing layers reacted with the sealing layer in the first and second glass substrates such that each of the reacted layers has a maximum depth of at least 30 nm from an interface with the sealing layer.

17. The process according to claim 15, further comprising producing the reacted layers so as to have central portions formed in a shape protruding toward the first and second glass substrates in comparison with portions thereof in the vicinity of end portions.

18. The process according to claim 15, comprising irradiating the sealing material layer with laser light as the electromagnetic wave, the laser light having an output density in a range of 250 to 10,000 $W/cm^2$.

19. The process according to claim 15, comprising irradiating the sealing material layer with infrared light as the electromagnetic wave, the laser light having an output density in a range of 1 to 30 $kW/cm^2$.

20. The process according to claim 15, comprising wherein the bismuth glass in the sealing glass contains $Na_2O$ in a range of 100 to 350 ppm, and the sealing material layer is irradiated with the electromagnetic wave such that the sealing material layer is heated at a temperature in a range of at least (T+300° C.) to at most (T+500° C.).

21. The electronic device according to claim 1, wherein a maximum depth D1 is at least 1.1 times a depth D2 in a vicinity of an end portion of said sealing layer.

* * * * *